United States Patent
Magri' et al.

(10) Patent No.: US 6,492,691 B2
(45) Date of Patent: *Dec. 10, 2002

(54) HIGH INTEGRATION DENSITY MOS TECHNOLOGY POWER DEVICE STRUCTURE

(75) Inventors: Angelo Magri', Belpasso (IT); Ferruccio Frisina, Sant'Agata Li Battiati (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,693

(22) Filed: May 25, 1999

(65) Prior Publication Data

US 2002/0113276 A1 Aug. 22, 2002

(30) Foreign Application Priority Data

May 26, 1998 (EP) .............................. 98830321

(51) Int. Cl.$^7$ ............................... H01L 29/76
(52) U.S. Cl. .................. 257/401; 257/341; 257/339; 257/409; 257/496
(58) Field of Search ................ 257/339, 409, 257/496, 401, 341

(56) References Cited

U.S. PATENT DOCUMENTS

| 4,015,278 A | 3/1977 | Fukuta |
| 4,055,884 A | 11/1977 | Jambotkar |
| 4,072,975 A | 2/1978 | Ishitani |
| 4,145,700 A | 3/1979 | Jambotkar |
| 4,206,469 A | * 6/1980 | Hanes et al. .................. 357/23 |
| 4,261,765 A | 4/1981 | Komatsu et al. |
| 4,293,868 A | * 10/1981 | Iizuka et al. .................. 357/46 |

(List continued on next page.)

FOREIGN PATENT DOCUMENTS

| CA | 1 123 119 | 5/1982 |
| CA | 1 136 291 A | 11/1982 |
| DE | 3 902 300 A1 | 8/1989 |
| EP | 0 119 400 A1 | 9/1984 |
| EP | 0 211 972 A1 | 3/1987 |
| EP | 0 237 932 A2 | 9/1987 |
| EP | 0 252 236 A3 | 1/1988 |
| EP | 0 279 403 A3 | 8/1988 |
| EP | 0 304 839 A3 | 3/1989 |

(List continued on next page.)

OTHER PUBLICATIONS

European Search Report from European Patent Application No. 95 83 0055, filed Feb 24, 1995.
European Search Report from European Patent Application No. 95 83 0454, filed Oct. 30, 1995.
European Search Report from European Patent Application No. 95 83 0468, filed Nov. 6, 1995.
Patent Abstracts of Japan, vol. 5, No. 40 (E–49), Mar. 17, 1981. Publication No. 55–163877, Toshiba Corp.

(List continued on next page.)

Primary Examiner—Eddie Lee
Assistant Examiner—Eugene Lee
(74) Attorney, Agent, or Firm—Wolf, Greenfield & Sacks, P.C.; James H. Morris; Robert A. Skrivanek, Jr.

(57) ABSTRACT

High density MOS technology power device structure, including body regions of a first conductivity type formed in a semiconductor layer of a second conductivity type, wherein the body regions include at least one plurality of substantially rectilinear and substantially parallel body stripes each joined at its ends to adjacent body stripes by junction regions, so that the at least one plurality of body stripes and the junction regions form a continuous, serpentine-shaped body region.

75 Claims, 6 Drawing Sheets

U.S. PATENT DOCUMENTS

| | | |
|---|---|---|
| 4,344,081 A | 8/1982 | Pao et al. |
| 4,345,265 A | 8/1982 | Blanchard |
| 4,376,286 A | 3/1983 | Lidow et al. |
| 4,399,449 A | 8/1983 | Herman et al. |
| 4,412,242 A | 10/1983 | Herman et al. |
| 4,414,560 A | 11/1983 | Lidow |
| 4,416,708 A * | 11/1983 | Abdoulin et al. ........... 148/187 |
| 4,512,816 A | 4/1985 | Ramde et al. |
| 4,593,302 A | 6/1986 | Lidow et al. |
| 4,605,948 A | 8/1986 | Martinelli |
| 4,642,666 A | 2/1987 | Lidow et al. |
| 4,680,853 A | 7/1987 | Lidow et al. |
| 4,705,759 A | 11/1987 | Lidow et al. |
| 4,716,126 A | 12/1987 | Cogan |
| 4,754,310 A | 6/1988 | Coe ............................... 29/6 |
| 4,767,722 A | 8/1988 | Blanchard |
| 4,798,810 A | 1/1989 | Blanchard et al. |
| 4,804,634 A | 2/1989 | Krishna et al. |
| 4,816,882 A | 3/1989 | Blanchard et al. |
| 4,901,127 A | 2/1990 | Chow et al. |
| 4,910,160 A | 3/1990 | Jennings et al. |
| 4,927,772 A | 5/1990 | Arthur et al. |
| 4,931,408 A | 6/1990 | Hshieh |
| 4,933,740 A * | 6/1990 | Baliga et al. ................. 357/38 |
| 4,940,671 A | 7/1990 | Small et al. |
| 4,959,699 A | 9/1990 | Lidow et al. |
| 4,963,972 A | 10/1990 | Shinohe et al. |
| 4,974,059 A | 11/1990 | Kinzer |
| 5,008,725 A | 4/1991 | Lidow et al. |
| 5,015,593 A | 5/1991 | Yawata et al. |
| 5,031,009 A | 7/1991 | Fujihira |
| 5,040,045 A * | 8/1991 | McArthur et al. ............. 357/53 |
| 5,043,781 A | 8/1991 | Nishiura et al. |
| 5,086,332 A * | 2/1992 | Nakagawa et al. ........... 357/51 |
| 5,119,153 A | 6/1992 | Korman et al. |
| 5,130,767 A | 7/1992 | Lidow et al. |
| 5,160,985 A | 11/1992 | Akiyama |
| 5,164,804 A | 11/1992 | Terashima |
| 5,191,396 A | 3/1993 | Lidow et al. |
| 5,208,471 A | 5/1993 | Mori et al. |
| 5,216,275 A | 6/1993 | Chen ............................. 29/76 |
| 5,258,636 A * | 11/1993 | Rumennik et al. .......... 257/339 |
| 5,286,984 A | 2/1994 | Nakagawa et al. |
| 5,321,292 A * | 6/1994 | Gongwer .................... 257/367 |
| 5,338,961 A * | 8/1994 | Lidow et al. ................ 257/342 |
| 5,382,538 A | 1/1995 | Zambrano et al. |
| 5,397,728 A | 3/1995 | Sasaki et al. |
| 5,418,179 A | 5/1995 | Hotta |
| 5,426,320 A | 6/1995 | Zambrano |
| 5,442,216 A | 8/1995 | Gough |
| 5,489,799 A | 2/1996 | Zambrano et al. |
| 5,508,217 A | 4/1996 | Sawada |
| 5,521,410 A | 5/1996 | Yamamoto .................. 257/342 |
| 5,534,721 A * | 7/1996 | Shibib ......................... 257/339 |
| 5,548,133 A | 8/1996 | Kinzer ......................... 257/155 |
| 5,563,436 A | 10/1996 | Barret et al. |
| 5,621,234 A | 4/1997 | Kato |
| 5,631,483 A | 5/1997 | Ferla et al. |
| 5,633,521 A * | 5/1997 | Koishikawa ................ 257/336 |
| 5,670,392 A | 9/1997 | Ferla et al. |
| 5,710,455 A * | 1/1998 | Bhatnagar et al. .......... 257/472 |
| 5,731,604 A | 3/1998 | Kinzer |
| 5,753,942 A | 5/1998 | Seok ........................... 257/133 |
| 5,795,793 A | 8/1998 | Kinzer |
| 5,798,554 A * | 8/1998 | Grimaldi et al. ............ 257/401 |
| 5,841,167 A | 11/1998 | Grimaldi et al. |
| 5,900,662 A | 5/1999 | Frisina et al. |
| 5,981,343 A | 11/1999 | Magri et al. |
| 5,981,998 A | 11/1999 | Frisina et al. |
| 5,985,721 A | 11/1999 | Frisina |
| 6,030,870 A | 2/2000 | Magri' e al. |
| 6,051,862 A | 4/2000 | Grimaldi et al. |
| 6,054,737 A | 4/2000 | Magri' et al. |
| 6,064,087 A | 5/2000 | Magri' et al. |
| 6,090,669 A | 7/2000 | Franco et al. |
| 6,111,297 A | 8/2000 | Grimaldi et al. |

FOREIGN PATENT DOCUMENTS

| | | | |
|---|---|---|---|
| EP | 0 358 389 A1 | 3/1990 | |
| EP | 0 393 949 A1 | 10/1990 | |
| EP | 0 405 138 A2 | 1/1991 | |
| EP | 0 405 138 A3 | 1/1991 | |
| EP | 0546377 A2 * | 11/1992 | ......... H01L/29/784 |
| EP | 0 543 313 A1 | 5/1993 | |
| EP | 0 632 503 A1 | 1/1995 | |
| EP | 0 671 769 A2 | 9/1995 | |
| EP | 0 685 886 A1 | 12/1995 | |
| EP | 0 768 714 A1 | 4/1997 | |
| EP | 0772241 A1 * | 5/1997 | ........... H01L/29/06 |
| EP | 0782201 A1 * | 7/1997 | ........... H01L/29/78 |
| EP | A-0 810 672 | 12/1997 | ........... H01L/29/78 |
| FR | 2 640 081 A1 | 8/1990 | |
| FR | 2 666 932 A2 | 3/1992 | |
| GB | 2 087 648 A | 5/1982 | |
| JP | 51 48981 | 4/1976 | |
| JP | 51 085381 | 7/1976 | |
| JP | 51 23088 | 9/1977 | |
| JP | 53 66181 | 6/1978 | |
| JP | 53 74385 | 7/1978 | |
| JP | 53 135284 | 11/1978 | |
| JP | 54 000885 | 1/1979 | |
| JP | 6-244412 * | 2/1993 | ......... H01L/29/784 |
| JP | 7-273325 | 10/1995 | |
| WO | WO94/11904 | 5/1994 | |

OTHER PUBLICATIONS

Patent Abstracts of Japan, vol. 8, No. 53 (E–231), Mar. 9, 1984, Publication No. 58–206174, Tokyo Shibaura Denki KK.

Patent Abstracts of Japan, vol. 11, No. 231(E–527), Jul. 28, 1987, Publication No. 62–047162, Matsushita Electric Works Ltd.

Patent Abstracts, vol. 14, No. 38 (E–878), Jan. 24, 1990, Publication No. 1–272163, Fuji Electric Co. Ltd.

Patent Abstracts of Japan, vol. 14, No. 387 (E–967), Aug. 21, 1990, Publication No. 2–143566, Toshiba Corp.

Patent Abstracts of Japan, vol. 15, No. 442 (E–1131), Nov. 11, 1991, Publication No. JP3185737, Toshiba Corp.

Patent Abstracts of Japan, vol. 17, No. 39 (E–1311), Jan. 25, 1993, Publication No. 4–256367, Hitachi Patent Ltd.

Patent Abstracts of Japan, vol. 17, No. 213 (E–1356), Apr. 26, 1993, Publication 4–349660, Toshiba Corp.

Mena J., et al., "High Frequency Performance of VDMOS Power Transistors", International Electron Devices Meeting. Technical Digest, Washington, D.C., USA, Dec. 8–10, 1980.

Galvagnot, G., et al., "Diffusion and Outdiffusion of Aluminum Implanted into Silicon," Semiconductor Science and Technology, Apr. 1993, UK, vol. 8, No. 4, pp. 488–494.

Pocha, Michael Donald, "High Voltage Double Diffused MOS Transistors for Integrated Circuits," Stanford Electronics Laboratories, Integrated Circuits Laboratory, Stanford University, Stanford, CA Technical Report No. 4956–1, Mar. 1976, pp. 229–240.

Yoshida, et al., "A High Power MOSFET with a Vertical Drain Electrode and a Meshed Gate Structure," IEEE Journal of Solid–State Circuits, vol. SC–11, No. 4, Aug. 1976, pp. 472–477.

"Labor and Materials to Design, Develop and Fabricate a 500V/2A N–Channel Metal Oxide Semiconductor F.E.T.," Siliconix Technical Proposal in response to N.A.F.I., Solicitation #N00163–77–R–1197, Aug. 31, 1977.

Sun, et al., "Modeling of the On–Resistance of LDMOS, VDMOS, and VMOS Power Transistors," IEEE Transactions on Electron Devices, vol. ED–27, No. 2, Feb. 1980, pp. 356–367.

McGregor, et al, "Small–Signal High–Frequency Performance of Power MOS Transistors," Solid State Electronics, vol. 27, No. 5, pp. 419–432, 1984.

Mena, et al., "Breakdown Voltage Design Considerations in VDMOS Structure," IEEE Transactions on Electron Devices, vol. ED–31, No. 1, Jan. 1984, pp. 109–113.

Mena, et al., "High–Voltage Multiple–Resistivity Drift–Region LDMOS," Solid State Electronics, vol. 29, No. 6, pp. 647–656, month unknown, 1986.

Krishna, "Second Breakdown in High Voltage MOS Transistors," Solid State Electronics, 1977, vol. 29, pp. 875–878.

"HEXFET, a new power technology, cuts on–resistance, boosts ratings," Electronic Design, For Engineers and Engineering Managers—Worldwide, Jun. 7, 1979, pp. 8276–8282.

ICs and semiconductors, pp. 8272–8275.

Yoshida (Applicant), "Methods For Manufacturing Insulated Gate Type Field Effect Transistors," Laid Open Patent Specification No. 85073/80, Laid Open Date: Jun. 26, 1980, Patent Application No. 75/162,677, Patent Application Date: Jan. 24, 1975, pp. 8235–8245.

Wolf, "Silicon Processing for the VLSI Era, Vol. 2: Process Integration," Lattice Press, pp. 143–152, month unknown, 1990.

* cited by examiner

HIGH INTEGRATION DENSITY MOS TECHNOLOGY POWER DEVICE STRUCTURE

BACKGROUND OF THE INVENTION

1. Field of the Invention

The present invention relates to MOS technology power devices, such as power MOSFETs, Insulated Gate Bipolar Transistors (IGBTs) and the like. More particularly, the present invention relates to MOS technology power device structures suitable for achieving a high integration density.

2. Discussion of the Related Art

The basic structure of a MOS technology power device is well known. In a lightly doped semiconductor layer of a first conductivity type ("drain layer"), generally formed by epitaxial growth over a heavily doped semiconductor substrate of the same or, as in the case of IGBTs, of a second opposite conductivity type, so-called "body regions" of the second conductivity type are formed. The body regions can be in the form of polygonal cells, for example square, rectangular or hexagonal, or they can be in the form of elongated stripes. The body regions include channel regions which are covered by an insulated gate layer, generally made of polysilicon. Inside the body regions, source regions of the first conductivity type are provided.

Each body region, together with the associated channel regions and source regions, forms an elementary MOS device. All the elementary MOS devices are connected in parallel to each other, and contribute a respective fraction to the overall current of the MOS technology power device.

In the quest to improve the performance of power MOS devices, the density of integration is constantly increasing; in this way, the chip area can be better exploited. An increased density of integration means an increased number of elementary MOS devices integrated in a same chip. This in turn means a progressive reduction of the size of the elementary MOS devices, i.e. of the body regions. A significant improvement in the integration density can be obtained by forming the body regions as elongated stripes instead of square or hexagons.

However, the reduction in size of the body regions poses some problems. Reference is made for example to the case of generally rectangular body regions shown in FIGS. 1 to 3. FIG. 1 is a top plan view of a small portion of a MOS technology power device chip, at the level of the surface of the drain layer 1 which, in the example, is assumed to be of the N conductivity type. The N type drain layer 1 is formed over a substrate 2 which can be of the N conductivity type or of the P conductivity type, depending on the kind of device (FIG. 3). In FIG. 1, four elementary MOS devices are shown. Each elementary MOS device comprises a respective body region 3, of the P conductivity type. Each body region includes a channel region 4 which, as shown in FIG. 3, is covered by an insulated gate 55 including a gate oxide layer 51 and a conductive gate layer 52, generally made of polysilicon. For the sake of clarity, the source regions are not depicted, since they are not relevant to the following explanation.

The body regions are generally rectangular. As better shown in FIG. 2, which is an enlarged view of an end of a body region, due to the reduction in size of the body regions, the short sides of the rectangle are actually rounded. Rh denotes the horizontal radius of the junction between the body region and the drain layer, while Rv in FIG. 3 denotes the vertical radius of such a junction.

It is generally known that the smaller the radius of a PN junction, the lower the reverse voltage it can sustain before entering breakdown. There is a lower limit in the size of the elementary MOS devices below which the horizontal radius Rh of the junction between the body region and the drain layer becomes more critical than the vertical radius Rv of the same junction, from the viewpoint of junction breakdown. By way of example, it has been verified that with a junction depth of about 2 $\mu$m an early breakdown of the body region-drain layer junction is experienced for body regions smaller than 5 $\mu$m. This poses a serious limitation to the increase of the integration density.

EP-A-0782201 discloses a structure for a MOS technology power device that achieves high integration density without incurring the above mentioned problem. The structure provides for forming the body regions in the form of elongated stripes ("body stripes"), and providing in the drain layer a continuous region of the second conductivity type surrounding all the body stripes, the ends of which are merged with the continuous region. In this way, it is possible to avoid the presence of junctions having a small radius of curvature. The resulting structure is similar to a mesh formed in the drain layer, and is useful for achieving a reduction of the minimum feature size down to 1 to 3 $\mu$m.

However, the provision of the continuous region surrounding the body stripes requires a dedicated mask and a dedicated implant. This makes the above solution rather disadvantageous in the case of MOS technology power devices designed for operating at low voltages (i.e., up to 100 V); these power devices do not need an edge structure (edge ring), so all the process steps necessary for the formation of the continuous doped region surrounding the body stripes are added to the normal manufacturing process flow.

In view of this state of the art, it is an object of the present invention to provide a MOS technology power device structure suitable for achieving a high integration density without exhibiting problems of early junction breakdown, and not requiring additional process steps with respect to the conventional manufacturing process.

SUMMARY OF THE INVENTION

According to the present invention, this and other objects are achieved in a high density MOS technology power device structure, comprising body regions of a first conductivity type formed in a semiconductor layer of a second conductivity type, wherein said body regions comprise at least one plurality of substantially rectilinear and substantially parallel body stripes each joined at its ends to adjacent body stripes by means of junction regions, so that said at least one plurality of body stripes and said junction regions form a continuous, serpentine-shaped body region.

As a result of the present invention, high densities of integration can be achieved. The provision of the body regions in the form of stripes allows increasing the integration density, as mentioned in the above discussion. The width of the stripes can be reduced down to the minimum feature size of the technological process. Additionally, the fact that the stripes are joined at their free, ends by junction regions eliminates the presence of regions having a small horizontal radius of curvature. Thus, early breakdown can be prevented. Compared to the solution proposed in EP-A-0782201, providing for the formation of a continuous region surrounding and merged with the body stripes, the present invention does not need any dedicated process step for its fabrication, and this is a clear advantage.

BRIEF DESCRIPTION OF THE DRAWINGS

The features and advantages of the invention will be made apparent by the following detailed description of three particular embodiments therefore, illustrated by way of non-limiting examples only in the annexed drawings, wherein.

DETAILED DESCRIPTION

Figure 4:
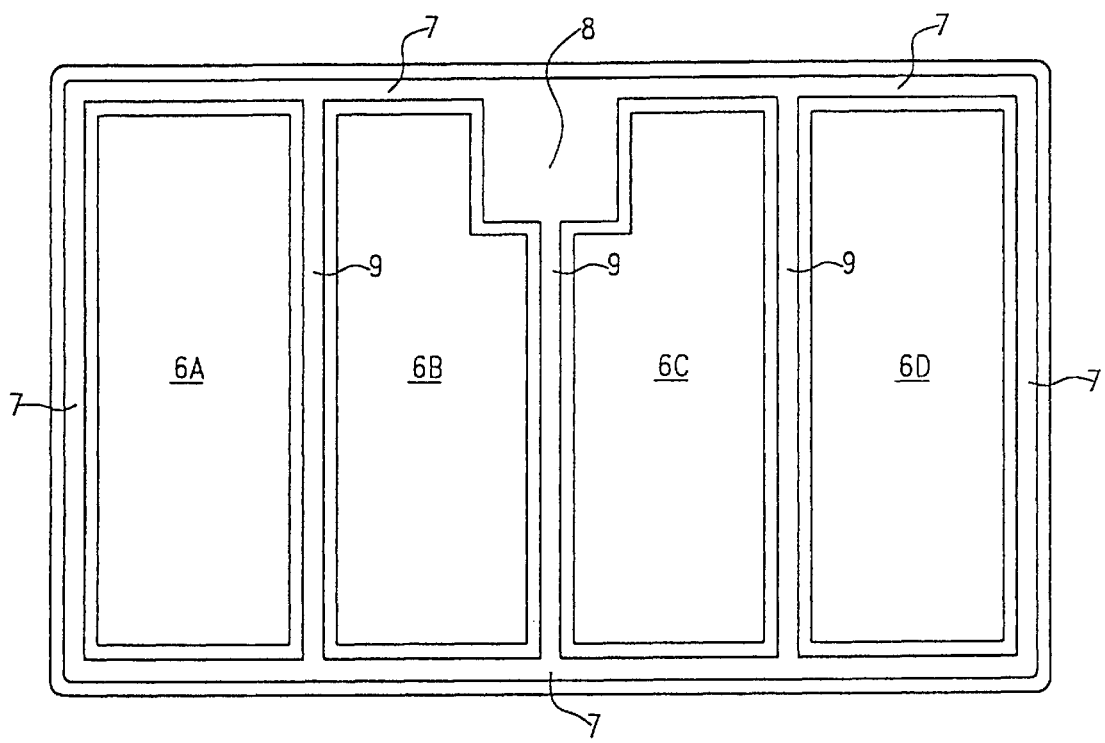
FIG. 4 is a top-plan view of a chip wherein a MOS technology power device according to the present invention is integrated.

FIG. 4 shows in top-plan view a chip wherein a MOS technology power device having a structure according to the present invention is integrated. The chip is shown at its uppermost level. Source metal plates 6A, 6B, 6C, 6D cover respective portions of the chip. A gate metal ring 7 runs along the periphery of the chip departing from a gate metal bonding area 8. Gate metal fingers 9 connected at their ends to the gate metal ring 7 or directly to the gate metal bonding area 8 separate the source metal plates 6A, 6B, 6C, 6D.

Figure 5:
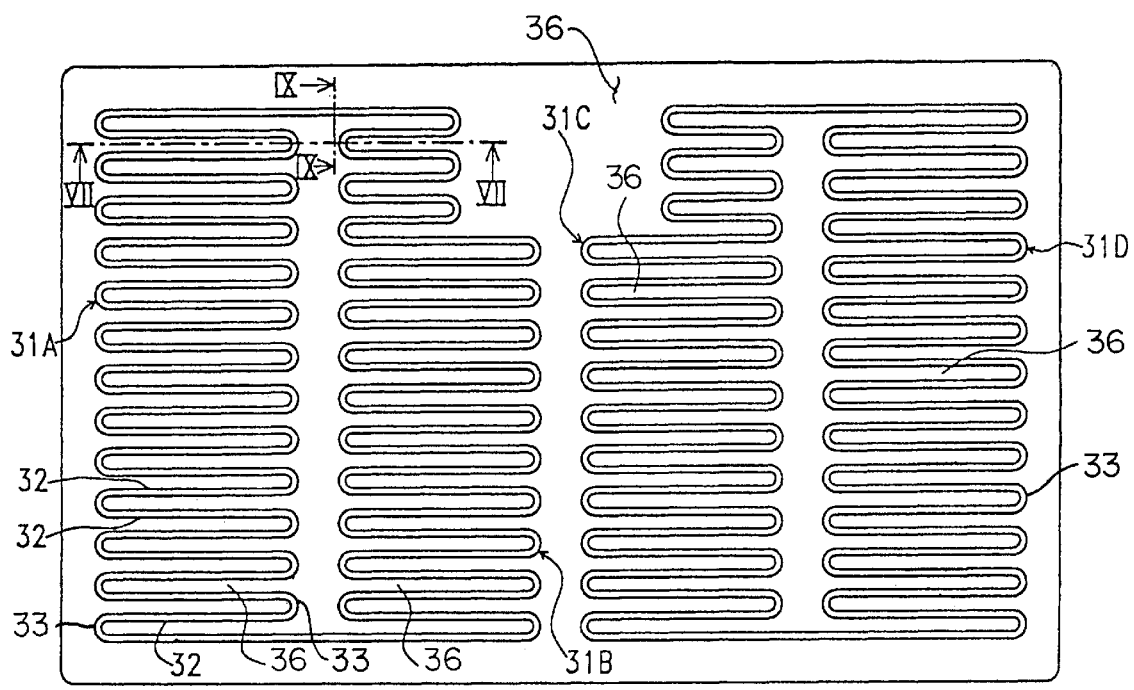
FIG. 5 is a top-plan view of the chip of FIG. 4, at a lower level, showing a MOS technology power device structure according to a first embodiment of the invention.
Figure 6:
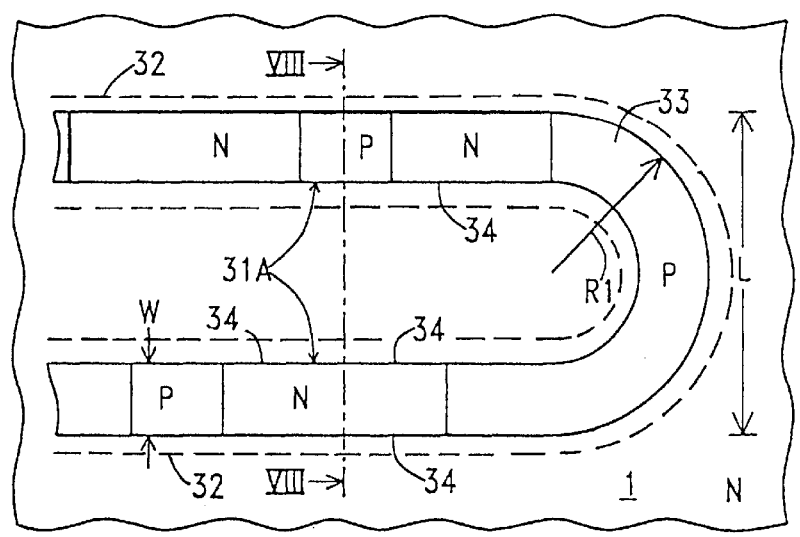
FIG. 6 is an enlarged view of a detail of the structure of FIG. 5.
Figure 7:
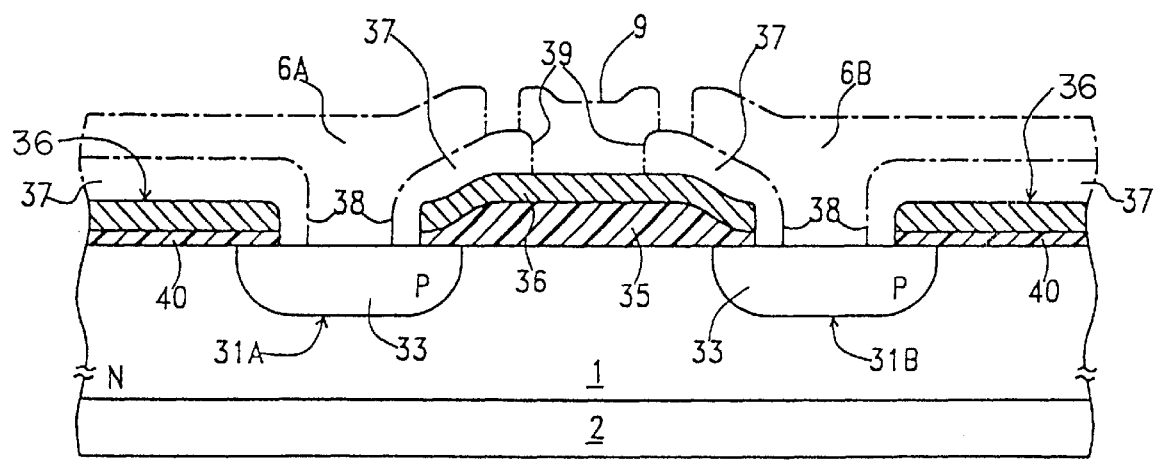
FIG. 7 is a cross-sectional view along line VII—VII of FIG. 5.
Figure 8:
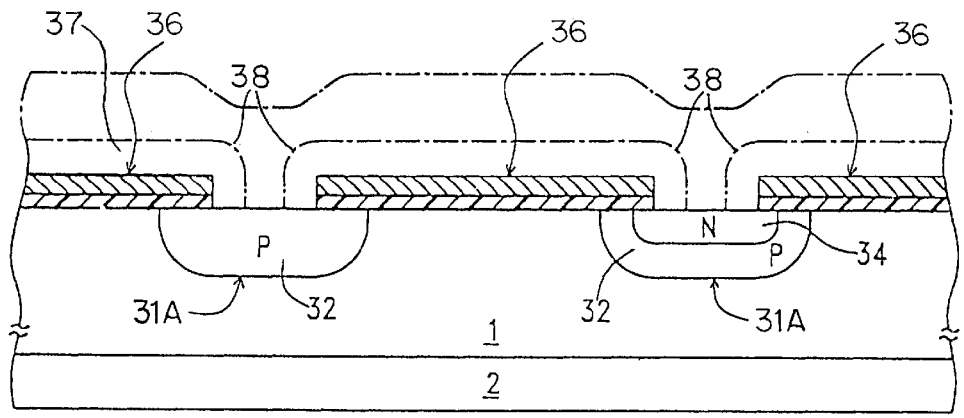
FIG. 8 is a cross-sectional view along line VIII—VIII of FIG. 6.

Referring now to FIGS. 5 to 8, a first embodiment of the invention is shown. FIG. 5 shows the structure in top-plan view at the level of the insulated gate layer. In each of the regions of the chip located under each source metal plate 6A, 6B, 6C, 6D a continuous body region 31A, 31B, 31C, 31D, of the P conductivity type in the shown example, is formed. Each continuous body region 31A, 31B, 31C, 31D has substantially the form of a serpentine; each continuous body region 31A, 31B, 31C, 31D can also be viewed as formed by a plurality of rectilinear, substantially parallel stripes 32, joined at their ends to adjacent stripes 32 by means of approximately rounded connection portions 33. Inside the rectilinear stripes 32 N type source regions are formed. The source regions are shown in the enlarged view of FIG. 6, but not in FIG. 5 for the sake of clarity. Preferably, the source regions 34 are arranged inside the rectilinear stripes 32 so as to leave source-free portions of the P stripes intercalated between the N source regions. More advantageously, the arrangement of N source regions inside adjacent stripes 32 is such that an N source region inside a stripe faces a source-free portion of the adjacent P stripes (FIG. 8). A similar source layout is disclosed in EP-A-0772241, to which explicit reference is made. However, this particular layout is shown by way of example only, since other arrangements of the source regions inside the body region could be suitable; the particular arrangement of the source region inside the body regions is not a limitation to the present invention.

In this embodiment of the invention, the four serpentine-shaped continuous body regions 31A, 31B, 31C, 31D are connected in pairs, so as to form two closed serpentine pairs. Obviously, the number of closed serpentine pairs is not a limitation, since a different number of closed serpentine pairs could be provided in the chip. As shown in FIG. 7, between each of the serpentines of a closed serpentine pair, for example between the serpentine pairs 31A and 31B, the polysilicon gate layer 36 is isolated from the semiconductor surface by thick field oxide regions 35. The same field oxide 35 is provided in the central region of the chip of FIG. 5, between the two closed serpentine pairs, and all around the chip, under the gate metal ring 7 (FIG. 9).

Figure 9:
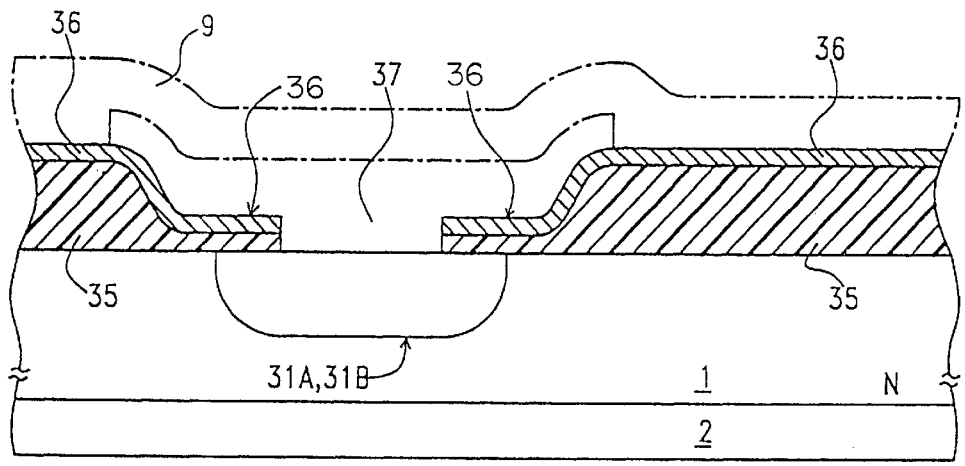
FIG. 9 is a cross-sectional view along line IX—IX of FIG. 5.

As shown in FIGS. 7, 8 and 9, a dielectric layer 37 is provided between the source metal plates 6A, 6B, 6C, 6D and the polysilicon gate layer 36. Windows 38 (FIGS. 7 and 8) are formed in the dielectric layer 37 over the serpentine-shaped body regions 31A, 31B, 31C, 31D to allow the respective source metal plate 6A, 6B, 6C, 6D to contact the source regions 34 and the source-free P portions of the body regions 31A, 31B, 31C, 31D. Windows 39 (FIG. 7) are also formed in the dielectric layer 37 to allow the gate metal fingers 9 to contact the polysilicon gate layer 36. In order to prevent the gate metal fingers 9 from coming into contact with the body regions of the device, the dielectric layer 37 also covers the body regions at the crossing of the gate metal fingers 9 (FIG. 9).

Figure 1:
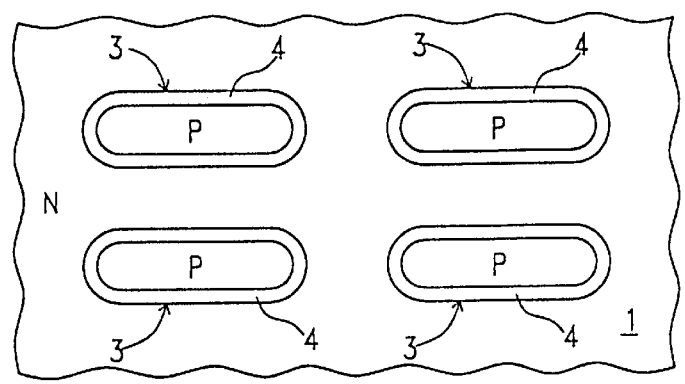
FIG. 1 is a top-plan view of a portion of a MOS technology power device according to the prior art.
Figure 2:
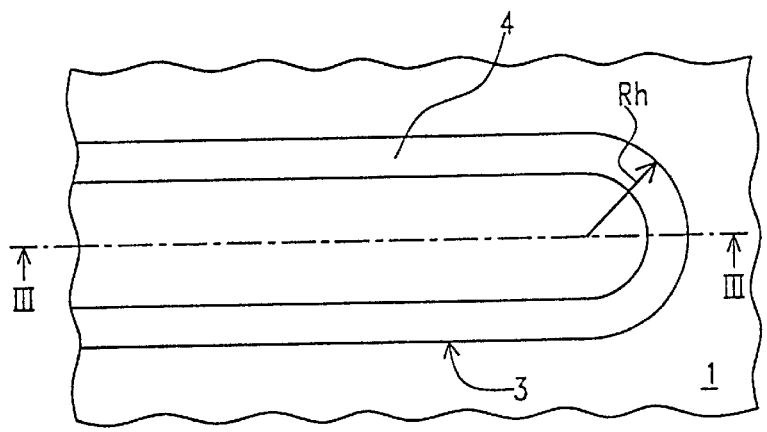
FIG. 2 is an enlarged view of a detail of FIG. 1.
Figure 3:
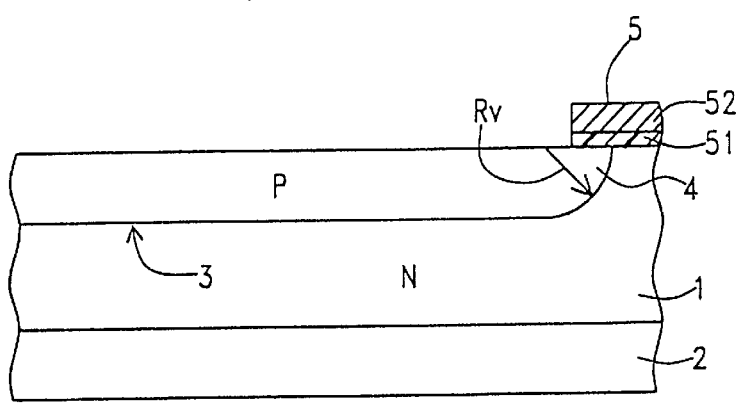
FIG. 3 is a cross-sectional view along line III—III of FIG. 2.

The proposed structure overcomes the problem of early breakdown of the junction between the body regions and the drain layer caused by small horizontal radii of such a junction. In fact, the structure completely avoids the presence of terminations of the body stripes 32. The reduction in size of the stripes necessary for achieving a high integration density would cause such terminations to have a small radius, as shown in FIGS. 1 to 3, causing an early breakdown. By contrast the present invention, by providing the junction of the body stripes 32 by means of the substantially rounded portions 33, is not affected by the above problem. In fact, the radius of the rounded junction portions 33 is sufficiently large to avoid triggering of early breakdown, since the spacing between adjacent body stripes 32 is normally larger than the width W of the body stripes 32. Thus, the dimension L equal to the sum of the width W of two adjacent body stripes 32, plus the spacing therebetween, is larger than the width W of the single body stripe 32. For example, the width W can be of approximately 1 $\mu$m, and the dimension L of approximately 6 $\mu$m; this means that the junction regions 33 have a horizontal radius of approximately 3 $\mu$m, while if each single body stripe were to be terminated, the termination would have a horizontal radius of 0.5 $\mu$m. Furthermore, differently from the mesh structure disclosed in EP-A-0782201, the present invention does not require any additional process step.

In fact, a manufacturing process suitable for obtaining the MOS technology power device structure according to this first embodiment starts as usual with the formation of the lightly doped N type drain layer 1 over the heavily doped substrate 2 (of the N type as well in the case of a power MOSFET, of the P type in the case of an IGBT). The drain layer 1 is typically formed by means of epitaxial growth.

Then, a thick field oxide layer is grown over the drain layer. The thick field oxide layer is selectively etched to form the field oxide regions 35. The regions of the chip where the field oxide has been removed are the so-called active areas of the chip. In said active areas, the gate oxide layer 40 is formed.

Then, a layer of polysilicon is deposited over the whole surface of the chip. The polysilicon layer can be doped to reduce its resistivity; also, a layer of silicide can be formed over the polysilicon layer to further reduce its resistivity.

Subsequently, by means of a photolithographic mask, the polysilicon layer is etched to define therein serpentine-shaped openings as shown in FIG. 5.

Then, using the polysilicon layer as a mask, P type dopant is introduced in the drain layer 1 to form the serpentine-shaped body reigons 31A, 31B, 31C, 31D. To this purpose, several different processes can be used. One process provides, for example, for implanting a rather heavy dose of a P type dopant with an energy sufficiently high to locate the peak dopant concentration at a prescribed distance from the surface of the drain layer, and then making the implanted dopants diffuse laterally and vertically to respectively obtain body regions 31 having a central heavily doped portion, and lateral lightly doped channel portions. Another suitable process provides for performing two distinct implants of P type dopants, with different doses and different energies, to respectively form the lightly doped channel portions and the central heavily doped portion of the body regions. Another process provides, for example, for forming the lateral channel portions of the body regions by means of tilted implants, and the heavily doped portion by means of orthogonal implants, without any thermal diffusion process of the dopants. The particular process used to form the serpentine-shaped body regions 31A, 31B, 31C, 31D is not a limitation to the present invention.

Afterwards, the N type source regions 34 are formed inside the body regions 31A, 31B, 31C, 31D. This involves a selective implantation of N type dopants, requiring a suitable photolithographic mask, and then a thermal diffusion of the dopants.

Then, the dielectric layer 37 is deposited over the whole chip surface. The dielectric layer 37 is then selectively etched by means of a photolithographic process involving a dedicated mask to open the windows 38 and 39.

Then, a metal layer is first deposited over the whole chip surface, and then selectively etched by means of another photolithographic process involving the use of a further photolithographic mask. In this way, the source metal plates 6A, 6B, 6C, 6D, the gate metal fingers 9 and the gate metal rings 7 are formed.

Figure 12:
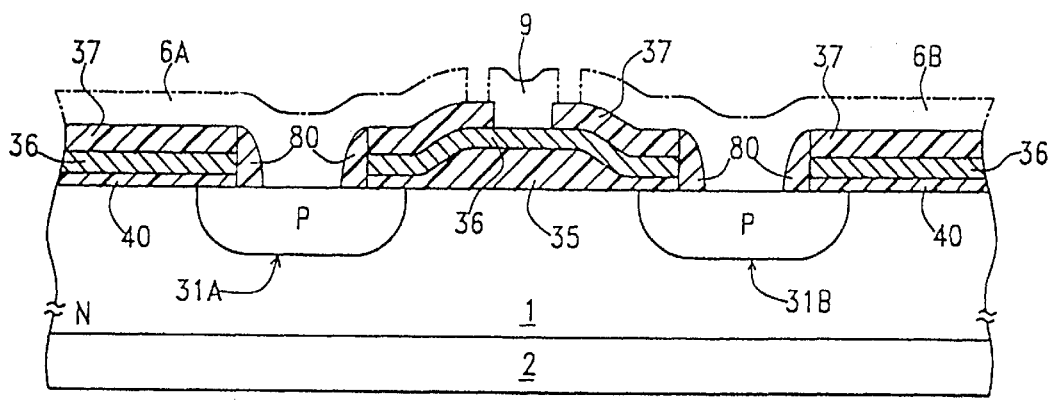
FIG. 12 is a cross-sectional view along line XII—XII of FIG. 10.
Figure 10:
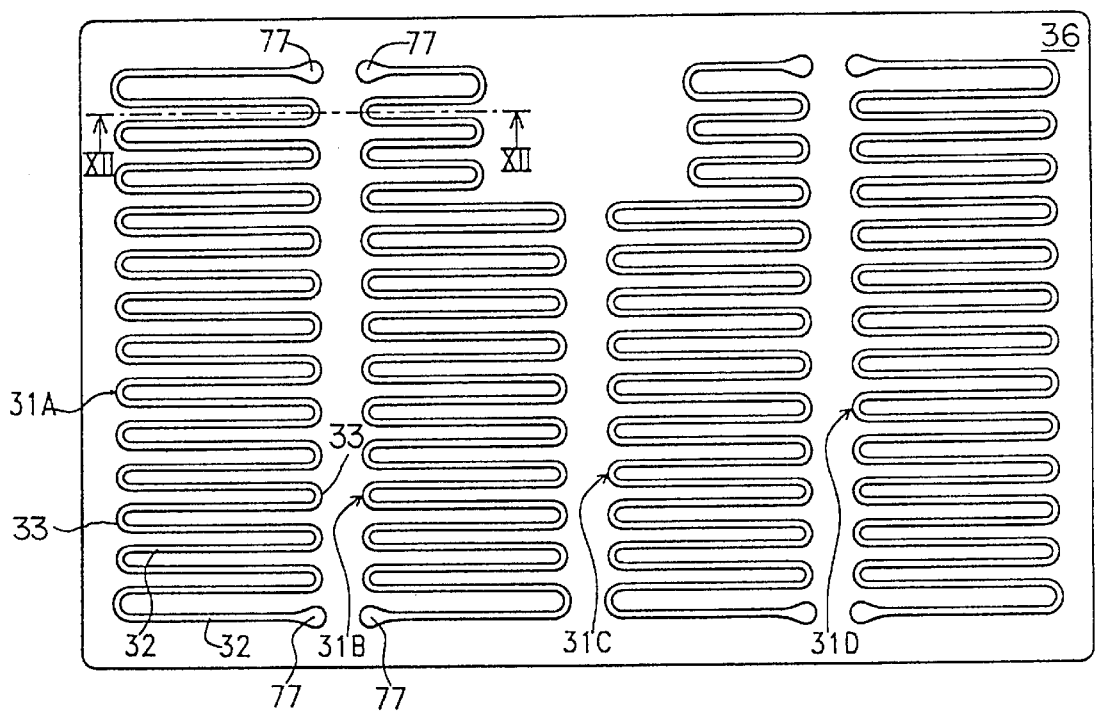
FIG. 10 is a top-plan view similar to that shown in FIG. 5, referring to a MOS technology power device structure according to a second embodiment of the invention.
Figure 11:
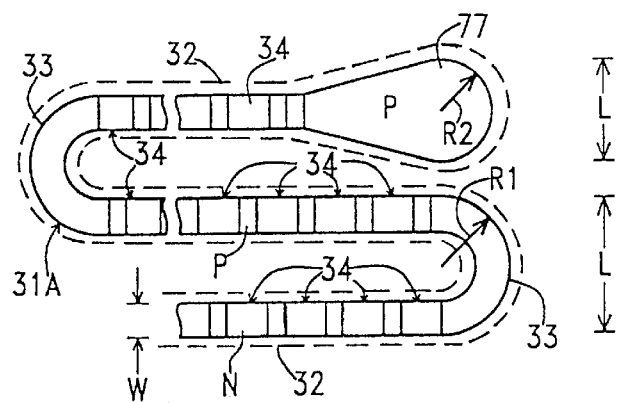
FIG. 11 is an enlarged view of a detail of the structure of FIG. 10.

In FIGS. 10 to 12 there is shown a second embodiment of the invention. Differently from the first embodiment, the serpentine-shaped body regions 31A, 31B, 31C, 31D are not connected together in pairs to form pairs of closed serpentine-shaped body regions. Thus, the serpentine-shaped body regions 31A, 31B, 31C, 31D each have two free ends 77.

However, in order not to have problems of early breakdown at the free ends 77 of each serpentine due to small horizontal radii of curvature of the junction with the drain layer, such ends 77 are made larger than the width W of the substantially rectilinear stripes 32. For example, as visible in FIG. 11, each end 77 has a width L equal to the overall width of two adjacent body stripes 32, so that the horizontal radius R2 of the termination of the end 77 is equal to the horizontal radius R1 of the rounded portions 33. In this way, even if the serpentine-shaped body regions 31A, 31B, 31C, 31D have free ends 77, PN junctions with small horizontal radius of curvature are avoided.

A structure according to this second embodiment of the invention is suitable in the case where the openings in the dielectric layer 37 that isolates the polysilicon gate 36 from the source metal plates 6A, 6B, 6C, 6D are formed in a self-aligned mariner to the openings in the polysilicon gate layer 36, as shown in FIG. 12, so that the gate oxide layer 40, the polysilicon gate layer 36 and the dielectric layer 37 form a stack with openings over the body regions 31A, 31B, 31C, 31D having substantially vertical walls, and insulating material sidewall spacers 80 are provided to seal the polysilicon gate layer 36.

A manufacturing process for this structure starts again with the formation of the lightly doped N type drain layer 1 over the heavily doped substrate 2.

Then, a thick field oxide layer is grown over the drain layer. The thick field oxide layer is selectively etched to form the field oxide regions 35. In the active areas of the chip wherein the field oxide layer has been removed, the gate oxide layer 40 is formed.

Then, a layer of polysilicon is deposited over the whole surface of the chip. The polysilicon layer can be doped to reduce its resistivity; also, a layer of silicide can be formed over the polysilicon layer to further reduce its resistivity.

At this point, differently from the previously described process, a dielectric layer is deposited over the whole surface of the chip.

Subsequently, by means of a separate photolithographic mask, the dielectric layer and the underlying polysilicon layer are etched to define therein serpentine-shaped openings as shown in FIG. 10.

Then, using the dielectric layer and the polysilicon layer as a mask, P type dopants are introduced in the drain layer 1 to form the serpentine-shaped body regions 31A, 31B, 31C, 31D. To this purpose, one of the previously mentioned techniques, as well as any other suitable technique can be used.

Afterwards, the N type source regions 34 are formed inside the body regions 31. This involves a selective implantation of N type dopants, requiring a suitable photolithographic mask, and then a thermal diffusion of the dopants.

Then, the insulating material sidewall spacers 80 are formed. To this purpose, one or more dielectric layers are deposited, and the dielectric layers are then vertically etched to define the spacers 80.

Then, the remaining dielectric layers covering the polysilicon regions are removed by means of a dedicated photolitography to open contact windows on polysilicon.

A metal layer is first deposited over the whole chip surface, and then selectively etched by means of another photolithographic process involving the use of a further photolithographic mask. In this way, the source metal plates 6A, 6B, 6C, 6D, the gate metal fingers 9, the gate metal ring 7 and the gate bonding area 8 are formed.

The reason why the serpentine-shaped body regions 31A, 31B, 31C, 31D can not be connected to form closed serpentines and shall instead have free ends is a consequence of the manufacturing process used. In fact, since the dielectric layer 37 is etched using the same mask of that used to etch the polysilicon layer 36, it is not possible to leave the dielectric layer over the body region at the crossing of the gate metal fingers 9.

Figure 13:
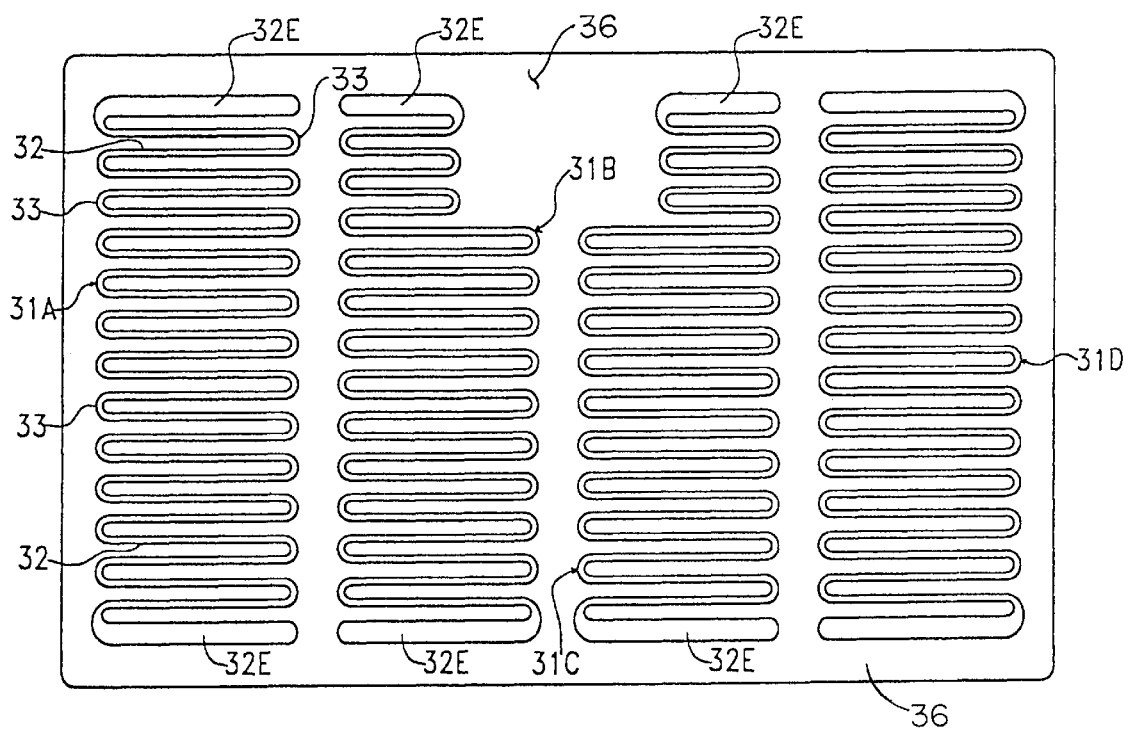
FIG. 13 is a top-plan view similar those shown in FIGS. 5 and 10, referring to a MOS technology power device structure according to a third embodiment of the invention.
Figure 14:
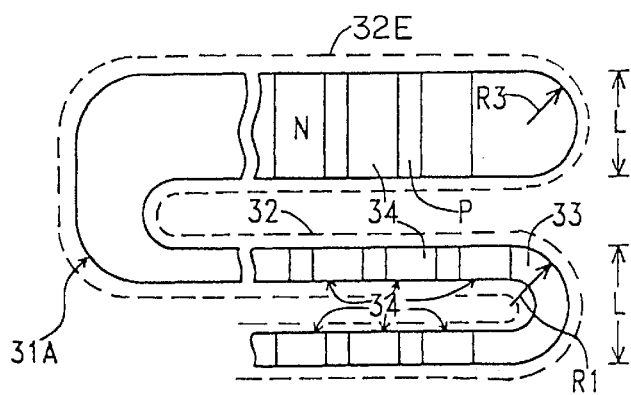
FIG. 14 is an enlarged view of the structure of FIG. 13.

FIGS. 13 and 14 refer to a third embodiment of the invention which, similarly to the second embodiment, is suitable in the case of a manufacturing process providing for a self-aligned etch of the polysilicon gate layer and the dielectric layer. Also in this embodiment the serpentine-shaped body regions 31A, 31B, 31C, 31D shall have free ends. As an alternative way, compared to the second embodiment, for avoiding the presence of small horizontal radius junctions, the first and the last body stripes 32E of each serpentine 31A, 31B, 31C, 31D are formed wider than the other stripes 32, particularly the first and the last of said stripes 32E are formed with a width L equal to the width of a pair of adjacent stripes 32, as shown in detail in FIG. 14. Again, this allows the free ends of the serpentine-shaped body regions to have a horizontal radius R3 equal to the radius R1 of the rounded junction portions 33 between the body stripes 32.

Making only the first and the last stripes 32E wider than the remaining body stripes 32 of the serpentine-shaped body regions 31A, 31B, 31C, 31D does not affect the integration density of the device. So, this structure allows for achieving very high integration densities.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. High density MOS technology power device, comprising body regions of a first conductivity type formed in a semiconductor layer of a second conductivity type, wherein each respective body region includes a plurality of substantially rectilinear and substantially parallel body stripes, each body stripe of the plurality of body stripes being joined at at least one end to an adjacent body stripe of the plurality of body stripes by junction regions, so that the plurality of body stripes and said junction regions form a continuous, serpentine-shaped body region, and wherein each continuous, serpentine-shaped body region is surrounded by an insulated gate layer of the high density MOS technology power device.

2. High density MOS technology power device according to claim 1, comprising at least two continuous, serpentine-shaped body regions joined at their respective free ends to form a closed serpentine.

3. High density MOS technology power device comprising body regions of a first conductivity type formed in a semiconductor layer of a second conductivity type, wherein said body regions comprise at least one plurality of substantially rectilinear and substantially parallel body stripes each joined at its ends to adjacent body stripes by junction regions, so that said at least one plurality of body stripes and said junction regions form a continuous, serpentine-shaped body region, wherein said at least one plurality of body stripes includes a first body stripe and a last body stripe each having a free end, and wherein the free ends of the first and last body stripes of said at least one plurality of body stripes forming said serpentine-shaped body region are wider than remaining body stripes of said at least one plurality of body stripes so as to avoid a formation in said semiconductor layer of a junction having a small horizontal radius.

4. High density MOS technology power device according to claim 3, wherein substantially a whole of the first and last body stripes is wider than the remaining body stripes.

5. High density MOS technology power device according to claim 3, wherein one of the free ends of the first and last body stripes, and the first and last body stripes have a width substantially equal to a sum of a width of two adjacent body stripes plus a distance between the two adjacent body stripes.

6. High density MOS technology power device according to claim 1, wherein inside each of the plurality of body stripes source regions of the second conductivity type are provided.

7. High density MOS technology power device according to claim 1, wherein the insulated gate layer is provided over said semiconductor layer, the insulated gate layer having a serpentine-shaped opening over each respective continuous, serpentine-shaped body region.

8. High density MOS technology power device according to claim 7, wherein over the insulated gate layer a dielectric layer is provided.

9. High density MOS technology power device according to claim 8, wherein said dielectric layer has openings over each respective continuous, serpentine-shaped body region to allow a superimposed source metal layer to contact said source regions and the respective continuous, serpentine-shaped body region.

10. High density MOS technology power device according to claim 9, wherein said openings in said dielectric layer are self-aligned with the opening in the insulated gate layer, and insulating sidewall spacers are provided at an edge of said openings in said dielectric layer and the insulated gate layer to isolate the insulated gate layer from the source metal layer.

11. High density MOS technology power device according to claim 1, wherein the high density MOS technology power device is a field effect transistor (FET).

12. High density MOS technology power device according to claim 1, wherein the high density MOS technology power device is an insulated gate bipolar transistor (IGBT).

13. High density MOS technology power device, comprising body regions of a first conductivity type formed in a semiconductor layer of a second conductivity type, wherein said body regions include at least one plurality of substantially rectilinear and substantially parallel body stripes each joined at its ends to adjacent body stripes by junction regions, so that said at least one plurality of body stripes and said junction regions form a continuous, serpentine-shaped body region, and wherein said at least one plurality of body stripes and said junction regions forming the continuous, serpentine-shaped body region is surrounded by an insulated gate layer of the high density MOS technology power device;

wherein a first body stripe of the plurality of said at least one plurality of body stripes and said junction regions forming the continuous, serpentine-shaped body region includes a plurality of source regions of the second conductivity type, each source region of the plurality of source regions being intercalated between portions of the first body stripe that do not include any source region.

14. High density MOS technology power device according to claim 13, wherein each of said junction regions do not include any source regions.

15. High density MOS technology power device according to claim 13, wherein the plurality of source regions of the second conductivity type are a first plurality of source regions, wherein a second body stripe of the plurality of said at least one plurality of body stripes and said junction regions forming the continuous, serpentine-shaped body region includes a second plurality of source regions of the second conductivity type, each source region of the second plurality of source regions being intercalated between portions of the second body stripe that do not include any source region, and wherein the first plurality of source regions of the first body stripe face the portions of the second body stripe that do not include any source region.

16. High density MOS technology power device, comprising body regions of a first conductivity type formed in a semiconductor layer of a second conductivity type, wherein said body regions include at least one plurality of substantially rectilinear and substantially parallel body stripes each joined at its ends to adjacent body stripes by junction regions, so that said at least one plurality of body stripes and said junction regions form a continuous, serpentine-shaped body region, and wherein said at least one plurality of body stripes and said junction regions forming the continuous, serpentine-shaped body region is surrounded by an insulated gate layer of the high density MOS technology power device;

wherein each respective body stripe of the plurality of said at least one plurality of body stripes and said junction regions forming the continuous, serpentine-shaped body region includes a plurality of source regions of the second conductivity type, each source region of the plurality of source regions being intercalated between portions of the respective body stripe that do not include any source region.

17. A MOS power device, comprising:
a plurality of elongated and substantially parallel body stripes of a first conductivity type formed in a semiconductor layer of a second conductivity type, each of the plurality of body stripes including at least one source region of the second conductivity type and having a first end and a second end; and
a plurality of connection regions of the first conductivity type, each connection region of the plurality of connection regions adjoining one of the first end and the second end of a respective body stripe of the plurality of body stripes to one of the first end and the second end of an adjacent body stripe of the plurality of body stripes to form a continuous body region, each connection region of the plurality of connection regions not including any source regions of the second conductivity type.

18. The MOS power device of claim 17, wherein each of the plurality of connection regions is rounded.

19. The MOS power device of claim 17, wherein the plurality of connection regions include a first connection region that adjoins the first ends of a first pair of adjacent body stripes and a second connection region that adjoins the second ends of a second pair of adjacent body stripes.

20. The MOS power device of claim 17, wherein the plurality of body stripes include first, second, and third body stripes, the second body stripe being disposed adjacent to the first and third body stripes;
wherein the plurality of connection regions include first and second connection regions, the first connection region adjoining the first end of the first body stripe to the first end of the second body stripe and the second connection region adjoining the second end of the second body stripe to the second end of the third body stripe; and wherein the first, second and third body stripes and the first and second connection regions form a continuous, serpentine-shaped body region.

21. The MOS power device of claim 20, wherein the first and second connections regions are rounded.

22. The MOS power device of claim 21, wherein the second body stripe has a width and is separated from the first body stripe by a distance; and
wherein a radius of the first and second connection regions is approximately equal to one half of a sum of twice the width of the second body stripe plus the distance between the first body stripe and the second body stripe.

23. The MOS power device of claim 22, wherein the continuous, serpentine-shaped body region is surrounded by an insulated gate layer of the MOS power device.

24. The MOS power device of claim 23, wherein the insulated gate layer is formed over the semiconductor layer of the second conductivity type, the insulated gate layer having a serpentine-shaped opening over the continuous serpentine-shaped body region.

25. The MOS power device of claim 24, wherein a dielectric layer is provided over the insulated gate layer.

26. The MOS power device of claim 25, wherein the dielectric layer includes a plurality of openings over the continuous, serpentine-shaped body region to allow a superimposed source metal layer to contact each at least one source region of the second conductivity type and the continuous, serpentine-shaped body region.

27. The MOS power device of claim 26, wherein the plurality of openings in the dielectric layer are self-aligned with the serpentine-shaped opening in the insulated gate layer, and insulating sidewall spacers are provided at an edge of the plurality of opening in the dielectric layer and the serpentine shaped opening of the insulated gate layer to isolate the insulated gate layer from the source metal layer.

28. The MOS power device of claim 22, wherein the MOS power device is a field effect transistor (FET).

29. The MOS power device of claim 22, wherein the MOS power device is an insulated gate bipolar transistor (IGBT).

30. The MOS power device of claim 22, wherein the first body stripe includes a plurality of source regions of the second conductivity type, each source region of the plurality of source regions being intercalated between portions of the first body stripe that do not include any source region.

31. The MOS power device of claim 30, wherein the plurality of source regions of the first body stripe are a first plurality of source regions, wherein the second body stripe includes a second plurality of source regions of the second conductivity type, each source region of the second plurality of source regions being intercalated between portions of the second body stripe that do not include any source region, and wherein the first plurality of source regions of the first body stripe face the portions of the second body stripe that do not include any source region.

32. The MOS power device of claim 17, wherein the plurality of body stripes and the plurality of connection regions are arranged to form a continuous, serpentine-shaped body region.

33. The MOS power device of claim 32, wherein the continuous, serpentine-shaped body region is a first serpentine-shaped continuous body region, and wherein the MOS power device further comprises a second continuous, serpentine-shaped body region.

34. The MOS power device of claim 33, wherein the first continuous, serpentine-shaped body region is adjoined to the second continuous, serpentine-shaped body region to form a closed serpentine pair.

35. The MOS power device of claim 32, wherein the continuous, serpentine-shaped body region is a first continuous, serpentine-shaped body region, and wherein the MOS power device further comprises a plurality of continuous, serpentine-shaped body regions.

36. The MOS power device of claim 32, wherein the plurality of body stripes includes a first body stripe, a last body stripe, and a plurality of intermediate body stripes disposed substantially in parallel between the first body stripe and the last body stripe; and wherein the first body stripe and the last body stripe each includes a free end that is not adjoined to an adjacent body stripe of the plurality of body stripes by one of the plurality of connection regions.

37. The MOS power device of claim 36, wherein the free end of the first and last body stripes is wider than a remaining portion of the first and last body stripes.

38. The MOS power device of claim 36, wherein each of the plurality of connection regions is rounded;

wherein each intermediate body stripe of the plurality of intermediate body stripes has a width;

wherein each intermediate body stripe is separated from an adjacent body stripe by a distance; and wherein each of the plurality of connection regions has a radius that is approximately equal to one half of a sum of twice the width of a respective intermediate body stripe plus the distance between the respective intermediate body stripe and the adjacent body stripe.

39. The MOS power device of claim 38, wherein the free end of the first and last body stripes is rounded and has a radius that is approximately equal to the radius of each of the plurality of connection regions.

40. The MOS power device of claim 36, wherein substantially a whole of the first and last body stripes is wider than each of the plurality of intermediate body stripes.

41. The MOS power device of claim 40, wherein each of the plurality of connection regions is rounded;

wherein each intermediate body stripe of the plurality of intermediate body stripes has a width;

wherein each intermediate body stripe is separated from an adjacent body stripe by a distance; and wherein each of the plurality of connection regions has a radius that is approximately equal to one half of a sum of twice the width of a respective intermediate body stripe plus the distance between the respective intermediate body stripe and the adjacent body stripe.

42. The MOS power device of claim 38, wherein substantially the whole of the first and last body stripes has a width that is approximately equal to the radius of each of the plurality of connection regions.

43. A MOS power device, comprising:

a plurality of elongated and substantially parallel body stripes of a first conductivity type formed in a semiconductor drain layer of a second conductivity type, each respective body stripe of the plurality of body stripes having a width and a first end and a second end, the first end and the second end of each respective body stripe forming a rounded junction with the semiconductor drain layer having a radius; and means, formed in the semiconductor drain layer, for reducing the width of a respective body stripe of the plurality of body stripes without reducing the radius of the rounded junction formed by the first end and the second end of the respective body stripe.

44. The MOS power device of claim 43, wherein the means for reducing includes a first rounded connection region of the first conductivity type that adjoins the first end of the respective body stripe to the first end of an adjacent body stripe.

45. The MOS power device of claim 44, wherein the adjacent body stripe is a first adjacent body stripe, and wherein the means for reducing further includes a second rounded connection region of the first conductivity type that adjoins the second end of the respective body stripe to the second end of a second adjacent body stripe of the plurality of body stripes.

46. The MOS power device of claim 45, wherein the plurality of body stripes and the means for reducing form a continuous, serpentine-shaped body region of the MOS power device.

47. The MOS power device of claim 46, wherein each respective body stripe of the plurality of body stripes includes at least one source region of the second conductivity type, and wherein the means for reducing includes no source regions of the second conductivity type.

48. The MOS power device of claim 47, wherein the continuous, serpentine-shaped body region is surrounded by an insulated gate layer of the MOS power device.

49. The MOS power device of claim 48, wherein the insulated gate layer is formed over the semiconductor drain layer of the second conductivity type, the insulated gate layer having a serpentine-shaped opening over the continuous serpentine-shaped body region.

50. The MOS power device of claim 49, wherein a dielectric layer is provided over the insulated gate layer.

51. The MOS power device of claim 50, wherein the dielectric layer includes a plurality of openings over the continuous, serpentine-shaped body region to allow a superimposed source metal layer to contact each at least one source region of the second conductivity type and the continuous, serpentine-shaped body region.

52. The MOS power device of claim 51, wherein the plurality of openings in the dielectric layer are self-aligned with the serpentine-shaped opening in the insulated gate layer, and insulating sidewall spacers are provided at an edge of the plurality of opening in the dielectric layer and the serpentine shaped opening of the insulated gate layer to isolate the insulated gate layer from the source metal layer.

53. The MOS power device of claim 47, wherein a first body stripe of the plurality of body stripes includes a plurality of source regions of the second conductivity type, each source region of the plurality of source regions being intercalated between portions of the first body stripe that do not include any source region.

54. The MOS power device of claim 53, wherein the plurality of source regions of the first body stripe are a first plurality of source regions, wherein a second body stripe of the plurality of body stripes includes a second plurality of source regions of the second conductivity type, each source region of the second plurality of source regions being intercalated between portions of the second body stripe that do not include any source region, and wherein the first plurality of source regions of the first body stripe face the portions of the second body stripe that do not include any source region.

55. The MOS power device of claim 46, wherein the continuous, serpentine-shaped body region is a first serpentine-shaped continuous body region, and wherein the MOS power device further comprises a second continuous, serpentine-shaped body region.

56. The MOS power device of claim 55, wherein the first continuous, serpentine-shaped body region is adjoined to the second continuous, serpentine-shaped body region to form a closed serpentine pair.

57. The MOS power device of claim 45, wherein
the first and second rounded connection regions each has a radius that is approximately equal to one half of a sum of twice the width of the respective body stripe plus a distance between the respective body stripe and one of the first and second adjacent body stripe.

58. The MOS power device of claim 43, wherein the plurality of body stripes and the means for reducing form a continuous, serpentine-shaped body region of the MOS power device.

59. The MOS power device of claim 43, wherein each respective body stripe of the plurality of body stripes includes at least one source region of the second conductivity type, and wherein the means for reducing include no source regions of the second conductivity type.

60. The MOS power device of claim 43, wherein the MOS power device is a field effect transistor (FET).

61. The MOS power device of claim 43, wherein the MOS power device is an insulated gate bipolar transistor (IGBT).

62. A MOS power device, comprising:
a plurality of elongated and substantially parallel body stripes of a first conductivity type formed in a semiconductor layer of a second conductivity type, each respective body stripe of the plurality of body stripes having a width and a first end and a second end; and
a plurality of rounded connection regions of the first conductivity type that adjoin one of the first end and the second end of each respective body stripe to one of the first end and the second end of an adjacent body stripe of the plurality of body stripes, each of the plurality of rounded connection regions having a radius that is approximately equal to one half a sum of twice the width of a respective body stripe of the plurality of body stripes plus a distance between the respective body stripe and the adjacent body stripe to which it is adjoined.

63. The MOS power device of claim 62, wherein the MOS power device is a field effect transistor (FET).

64. The MOS power device of claim 62, wherein the MOS power device is an insulated gate bipolar transistor (IGBT).

65. The MOS power device of claim 62, wherein a first body stripe of the plurality of body stripes includes a plurality of source regions of the second conductivity type, each source region of the plurality of source regions being intercalated between portions of the first body stripe that do not include any source region.

66. The MOS power device of claim 65, wherein the plurality of source regions of the first body stripe are a first plurality of source regions, wherein a second body stripe of the plurality of body stripes includes a second plurality of source regions of the second conductivity type, each source region of the second plurality of source regions being intercalated between portions of the second body stripe that do not include any source region, and wherein the first plurality of source regions of the first body stripe face the portions of the second body stripe that do not include any source region.

67. The MOS power device of claim 62, wherein the plurality of body stripes and the plurality of rounded connection regions are arranged to form a continuous, serpentine-shaped body region.

68. The MOS power device of claim 67, wherein the continuous, serpentine-shaped body region is a first serpentine-shaped continuous body region, and wherein the MOS power device further comprises a second continuous, serpentine-shaped body region.

69. The MOS power device of claim 68, wherein the first continuous, serpentine-shaped body region is adjoined to the second continuous, serpentine-shaped body region to form a closed serpentine pair.

70. The MOS power device of claim 67, wherein the continuous, serpentine-shaped body region is a first continuous, serpentine-shaped body region, and wherein the MOS power device further comprises a plurality of continuous, serpentine-shaped body regions.

71. The MOS power device of claim 62, wherein the plurality of body stripes includes a first body stripe, a last body stripe, and a plurality of intermediate body stripes disposed substantially in parallel between the first body stripe and the last body stripe; and
wherein the first body stripe and the last body stripe each includes a free end that is not adjoined to an adjacent body stripe of the plurality of body stripes by one of the plurality of rounded connection regions.

72. The MOS power device of claim 71, wherein the free end of the first and last body stripes is wider than a remaining portion of the first and last body stripes.

73. The MOS power device of claim 72, wherein the free end of the first and last body stripes is rounded and has a radius that is approximately equal to the radius of each of the plurality of rounded connection regions.

74. The MOS power device of claim 71, wherein substantially a whole of the first and last body stripes is wider than each of the plurality of intermediate body stripes.

75. The MOS power device of claim 62, wherein each of the plurality of body stripes includes at least one source region of the second conductivity type; and
wherein each of the plurality of rounded connection regions do not include any source regions of the second conductivity type.

* * * * *